US011866327B2

United States Patent
Dushatinski et al.

(10) Patent No.: US 11,866,327 B2
(45) Date of Patent: Jan. 9, 2024

(54) BORON NITRIDE NANOTUBE MATERIALS FOR CRYOPUMPS AND OTHER LARGE VOLUME CONFIGURATIONS

(71) Applicant: BNNT, LLC, Newport News, VA (US)

(72) Inventors: Thomas G Dushatinski, Chesapeake, VA (US); Kevin C. Jordan, Newport News, VA (US); Michael W. Smith, Newport News, VA (US); Jonathan C. Stevens, Williamsburg, VA (US); R. Roy Whitney, Newport News, VA (US)

(73) Assignee: BNNT, LLC, Newport New (VA)

( * ) Notice: Subject to any disclaimer, the term of this patent is extended or adjusted under 35 U.S.C. 154(b) by 0 days.

(21) Appl. No.: 16/349,512

(22) PCT Filed: Nov. 29, 2017

(86) PCT No.: PCT/US2017/063752
§ 371 (c)(1),
(2) Date: May 13, 2019

(87) PCT Pub. No.: WO2018/102437
PCT Pub. Date: Jun. 7, 2018

(65) Prior Publication Data
US 2020/0055732 A1    Feb. 20, 2020

Related U.S. Application Data

(60) Provisional application No. 62/427,583, filed on Nov. 29, 2016.

(51) Int. Cl.
*C01B 21/064* (2006.01)
*B01D 9/00* (2006.01)

(52) U.S. Cl.
CPC ........ *C01B 21/0648* (2013.01); *B01D 9/0022* (2013.01)

(58) Field of Classification Search
CPC .... B05D 3/007; B01D 9/0022; C01B 21/0648
See application file for complete search history.

(56) References Cited

U.S. PATENT DOCUMENTS 6,250,984 B1 * 6/2001 Jin .................. B82Y 10/00
445/51
7,419,601 B2 * 9/2008 Cooper ............... C01B 32/15
210/683

(Continued)

FOREIGN PATENT DOCUMENTS

JP    4971836       7/2012
WO   2016/100715   6/2016

OTHER PUBLICATIONS

Kim et al.("Polymer Nanocomposites from Free-Standing, Macroscopic Boron Nitride Nanotube Assemblies" RSC Adv., 2015, 5, 41186 and supplemental ESI (Year: 2015).*

(Continued)

*Primary Examiner* — Nathan H Empie
(74) *Attorney, Agent, or Firm* — Joshua B. Brady; Nixon & Vanderhye, P.C.

(57) ABSTRACT

Boron nitride nanotube (BNNT) material can be placed in large volume configurations such as needed for cryopumps, high surface area filters, scaffolding for coatings, transition radiation detectors, neutron detectors, and similar systems where large volumes may range from cubic millimeters to cubic meters and beyond. The technology to secure the BNNT material includes creating a scaffold of a material acceptable to the final system such as stainless steel wires for a cryopump. The BNNTs can be arranged in the scaffold by freeze drying, filtration technologies, conformal surface attachment and BNNT "glue" where the as-synthesized BNNT material has been partially purified or fully purified and dispersed in a dispersant.

18 Claims, 11 Drawing Sheets

(56) References Cited

U.S. PATENT DOCUMENTS

| | | | | |
|---|---|---|---|---|
| 2005/0074479 | A1* | 4/2005 | Weber | A61F 2/0077 424/423 |
| 2005/0159805 | A1* | 7/2005 | Weber | A61L 31/16 623/1.15 |
| 2009/0142576 | A1 | 6/2009 | Liu et al. | |
| 2010/0009165 | A1* | 1/2010 | Patel | B82Y 30/00 428/323 |
| 2010/0078799 | A1* | 4/2010 | Zarbock | B81C 1/00269 438/107 |
| 2010/0239488 | A1* | 9/2010 | Zettl | B82Y 40/00 423/447.1 |
| 2014/0373558 | A1* | 12/2014 | Stutzman | F04B 37/08 252/181.1 |
| 2015/0065342 | A1* | 3/2015 | Li | B01J 20/28045 502/401 |
| 2015/0086607 | A1 | 3/2015 | Johnson et al. | |

OTHER PUBLICATIONS

Lee et al.("Functionalization, dispersion, and cutting of boron nitride nanotubes in water" J Phys. Chem. C 2012, 116, 1798-1804. (Year: 2012).*

Whitby et al."Geometric control and tuneable pore size distribution of buckypapers and buckydiscs" Carbon 46 (2008) 949-956 (Year: 2008).*

Yu et al."Superhydrophobic and Superoleophilic Boron Nitride Nanotube-Coated Stainless Steel Meshes of Oil and Water Separation" Adv. Mater. Interfaces 2014, 1, 1300002 p. 1-5; (Year: 2014).*

K.S. Kim, et al., "Polymer nanocomposites from free-standing, macroscopic boron nitride nanotube assemblies", RSC Advances, Apr. 2015, vol. 5, No. 51, pp. 41186-41192.

C.H. LEE, et al., "Functionalization, Dispersion, and Cutting of Boron Nitride Nanotubes in Water", The Journal of Physical Chemistry C., Dec. 27, 2011, vol. 116, No. 2, pp. 1798-1804.

International Search Report of PCT/US2017/063752 dated Feb. 5, 2018, 3 pages.

International Preliminary Report on Patentability of PCT/US2017/063752 dated Jan. 24, 2019, 17 pages.

Lahiri et al. "Boron Nitride Nanotube Reinforced Polylactide-Polycaprolactone Copolymer Composite: Mechanical Properties and Cytocompatibility with Osteoblasts and Macrophages in Vitro", Acta Biomaterialia, Elsevier, Amsterdam, NL, vol. 6, No. 9, Sep. 1, 2010, pp. 3524-3533.

* cited by examiner

BORON NITRIDE NANOTUBE MATERIALS FOR CRYOPUMPS AND OTHER LARGE VOLUME CONFIGURATIONS

CROSS REFERENCE TO RELATED APPLICATIONS

This application is the U.S. national phase of International Application No. PCT/US2017/063752 filed Nov. 29, 2017 which designated the U.S. and claims priority to U.S. Provisional Patent Application No. 62/427,583 filed Nov. 29, 2016, the entire contents of each of which are hereby incorporated by reference.

STATEMENT REGARDING GOVERNMENT SUPPORT

None.

FIELD OF THE INVENTION

The present disclosure relates to methods of placing boron nitride nanotubes (BNNTs) in large-volume configurations, such as may be used in cryopumps, high surface area filters, scaffolding for coatings, transition radiation detectors, neutron detectors, and similar systems that may benefit from the properties of BNNTs if the material is present in adequate volume and with sufficient structural rigidity.

BACKGROUND—INTRODUCTION

BNNTs may be manufactured by various techniques. For example, BNNTs produced by high temperature or high temperature high pressure methods typically are high quality BNNTs, i.e. the number of walls range from 1 to 10 (with most being 2-wall and 3-wall), the length-to-diameter ratios are typically 10,000 to 1 or higher, the BNNTs are catalyst free, and the BNNTs are highly crystalline (very few defects at a level of less than 1 per 100 diameters of length). However, depending on the process used and the synthesis conditions, there may be small particles of boron, amorphous boron nitride (a-BN), hexagonal boron nitride (h-BN) nanocages, and h-BN nanosheets present. These particles are typically tens of nanometers in scale but may be smaller or larger. Also, these small particles may account for anywhere from under 5 to over 95 percent of the mass of the as-synthesized material, depending on the manufacturing process, feedstock, and operating parameters.

BNNT material has several valuable properties. The density of the as-synthesized high temperature method BNNT materials is typically about 0.5 grams per liter (0.5 g/L) but easily varies by +/−50%. The as-synthesized material may be compressed to densities approaching 0.5 grams per cubic centimeter. When compressed, the as-synthesized material typically remains close to its compressed shape and density. Purified BNNT material with most of the boron particles, a-BN particles, h-BN nanocages, and h-BN nanosheets removed has similar densities to the as-synthesized materials, though the maximum density is typically less. The surface area of the as-synthesized high quality BNNT material is typically in the range of 100-200 $m^2/g$ or above depending on the choice of synthesis parameters.

It may be desirable to control the density of BNNT materials for a given application. Certain applications of carbon nanotubes (CNTs), graphene, and boron nitride nanosheets (BNNS) rely on a stable density. To achieve stable densities for those materials, a common technique is to add a small amount of polymer, silicone, or other similar material to act as glue. For some applications, various foaming agents such as carbon dioxide gas are used to disperse the material. Other applications utilize freeze drying technologies to disperse the materials and, in some cases, form aerogels. Most of these additives prevent the resultant CNT, graphene, and BNNS configurations from surviving at high temperatures in various environments of interest such as bake-out cycles in extreme high vacuum (XHV) cryopumps. Additionally, the chemical environments of some filters are not amenable to many of the additives. Accordingly, the contemporary approaches for stabilizing density in those materials are not useful for BNNTs.

While initial testing has been performed by simply stuffing as-synthesized BNNT materials into the large volumes with a few wires for support, this is not a viable commercial solution. Applications of large volume BNNT materials generally must be free of boron particles, capable of shipping, highly efficient with respect to manufacturing and operation, capable of withstanding an environment that includes vibrations, and survive gas and/or liquid flows that that can remove the BNNT materials. Accordingly, there exists a need for methods of constructing BNNTs for use in large volume configurations.

SUMMARY

As disclosed herein, BNNTs may be prepared in large volume configurations with stable density and structural strength suitable for various applications. For example, such BNNT materials have valuable application in cryopumps, high surface area filters, scaffolding for coatings, transition radiation detectors, neutron detectors, and similar systems that take advantage of the unique properties of BNNTs when the material is present in large volumes.

Methods of arranging BNNTs in large volume configurations include arranging scaffolding materials and applying a BNNT material onto the scaffolds. The BNNT material may be applied by one or more methods including a BNNT spray, coating with a BNNT buckypaper/mat, freeze drying, filtration, and BNNT gluing. In some embodiments, the scaffolds include BNNT fibers, stainless steel, Kevlar®, polymer fibers, carbon fibers, and glass fibers. In some embodiments, the spacing in the scaffold is about 0.3 to 10 mm. In some embodiments, the BNNT material is partially or fully purified.

Methods of coating a scaffold with a BNNT spray include dispersing a BNNT material to form a BNNT spray, coating the scaffold with the BNNT spray, and baking the BNNT-coated scaffold. The baking temperature may be about 60-140° C. in some embodiments, but the baking temperature and duration may be optimized for a specific embodiment. For example, a small area of under 10 cm by 10 cm may only take a minute or less while an area of a square meter may take tens of minutes unless a large oven is utilized. In some embodiments, the dispersant may include or be isopropyl alcohol. In some embodiments, the method further comprises pre-cleaning the scaffold and/or pre-coating the scaffold with at least one of a thermal plastic, indium, tin, tin alloy or other solder, and a low-temperature melting glass. In some embodiments, the method further comprises compressing the spray coating onto the scaffold and/or baking the BNNT-coated scaffold to remove volatile organic compounds. In some embodiments, the BNNT-coated scaffold may be baked in air or vacuum-baked at about 200° C., or alternatively baked in air at about 450° C. typically for 30 minutes to two hours if residual carbon is present. At that temperature, the residual carbon is converted to carbon dioxide. Those of ordinary skill in the art may determine the optimum baking temperature and duration for a particular embodiment.

Methods of coating a scaffold with a BNNT buckypaper/mat include layering the BNNT buckypaper/mat onto the scaffold and baking the BNNT-coated scaffold at a temperature of about 60-140° C. In some embodiments, the method further comprises pre-cleaning the scaffold and/or pre-coating the scaffold with at least one of a thermal plastic, indium, tin, tin alloy or other solder, and a low-temperature melting glass. In some embodiments, the method further comprises compressing the buckypaper/mat onto the scaffold to enhance or provide conformal attachment and/or baking the BNNT-coated scaffold to remove volatile organic compounds. In some embodiments, the BNNT-coated scaffold may be vacuum-baked at about 200° C. or baked in air at 450° C.

Disclosed herein are methods of freeze drying a BNNT material onto a scaffold. The methods include dispersing a BNNT material, freezing the dispersed BNNT material in a container, placing the dispersed BNNT material in a vacuum and lowering the temperature to below the freezing point of the dispersant, and returning the dispersed BNNT material to standard temperature and pressure. In some embodiments, the dispersant is at least one of methyl alcohol, ethyl alcohol, isopropyl alcohol, and a volatile organic compound in distilled water. In some embodiments, the dispersant is about 1-10 weight percent. In some embodiments, the temperature is lowered to about $-5°$ C. to $-80°$ C. In some embodiments, the temperature is lowered to about $-40°$ C.

Methods of making a BNNT buckypaper/mat include dispersing a BNNT material in a dispersant, shaping a buckypaper/mat into a desired form, placing a filter and/or release paper under the bottom of the desired form, pouring the dispersed BNNT material over the buckypaper/mat, and drying the coated buckypaper/mat. In some embodiments, the dispersant is at least one of methyl alcohol, ethyl alcohol, isopropyl alcohol, and a volatile organic compound. In some embodiments, the buckypaper/mat comprises at least one of a woven stainless steel grid, polymer fibers, glass fibers, and BNNT fibers. Some embodiments further comprise positioning one or more additional supports for the desired form.

Disclosed herein are BNNT glues, methods of making BNNT glues, and methods of using BNNT glues. In some embodiments, a BNNT glue comprises a BNNT mater and an alcohol, wherein the density of the BNNT material is about 0.1 to 3 mg/ml. In some embodiments, the BNNT material is partially purified or fully purified. In some embodiments, the alcohol is at least one of isopropyl alcohol, methyl alcohol, and ethyl alcohol. In some embodiments, the composition further comprises water, and may have a ratio of alcohol to water of about 100:0 to 50:50. Methods of making a BNNT glue include dispersing a BNNT material in a dispersant comprising an alcohol, wherein the dispersed BNNT material has a density of about 0.1 to 3 mg/ml.

In some embodiments, the BNNT material is dispersed by stirring or sonication. In some embodiments, the alcohol is at least one of isopropyl alcohol, methyl alcohol, and ethyl alcohol. In some embodiments, the method includes water, wherein the ratio of alcohol to water is about 100:0 to 50:50. Methods of using a BNNT glue include dispersing a BNNT material in a dispersant comprising an alcohol, spreading the dispersed BNNT material onto at least two pieces of BNNT buckypaper/mat, compressing the at least two pieces of BNNT buckypaper/mat, and heating the at least two pieces of BNNT buckypaper/mat to about 80-120° C. to evaporate any liquids. In some embodiments, the dispersed BNNT material is spread at a density of about 0.1-1 ml/cm$^2$. In some embodiments, the method further comprise baking the at least two pieces of BNNT buckypaper/mat to remove volatile organic compound(s). In some embodiments, the at least two pieces of BNNT buckypaper/mat are baked in a vacuum at about 200° C. or are baked in air at about 450° C.

DETAILED DESCRIPTION

BNNTs in large volume configurations have application in cryopumps, high surface area filters, scaffolding for coatings, transition radiation detectors, neutron detectors, and similar systems. Large volume configurations may range from cubic millimeters to over cubic meters of BNNT material. Supporting BNNTs in large volume configurations may involve combinations of a hierarchical scaffold of wires, meshes, and similar supports. This application incorporates by reference, in their entirety, International Application No. PCT/US16/32385, filed May 13, 2016, International Application No. PCT/US17/50287, filed Sep. 6, 2017, U.S. Provisional Patent Application No. 62/383,853, filed Sep. 6, 2016, U.S. Provisional Patent Application No. 62/397,050, filed Sep. 20, 2016, and U.S. Provisional Patent Application No. 62/398,941 filed Sep. 23, 2016.

In embodiments using a scaffold, the scaffold composition depends on factors including: whether the large volume will be cycled to low and/or high temperatures and/or both, i.e. ~0 K to over 800 K, or remain near room temperature; the chemicals that may be used in or come in contact with the BNNT material volume; and any flow of materials through the BNNT material volume. In some embodiments, the scaffold may be formed from one or more of BNNT fibers, stainless steel, Kevlar® and other polymer fibers, carbon fibers, glass fibers, and any other fiber that reacts well with BNNTs and any compositions passing through the volume. The shape of the scaffold may be determined based on the application. Some scaffold material may include space between supports that form the scaffold. In some embodiments, the spacing between supports of the scaffold may be about 0.3 to 10 mm.

After a scaffold is constructed, it may be placed in a container. Preferably, the container shape matches the shape that the BNNT large volume material will occupy in the application. For example, if the BNNT large volume material will occupy a thin cylinder volume in a cryopump, then the scaffold may be in the shape of a thin wafer, and the container may be sized and shaped such that after BNNT coating the coated scaffold has a thin cylindrical shape corresponding to the space in the cryopump. In some embodiments, the application itself may form the container for the BNNT large volume material. For example, one or more sections of the cryopump may be used to form one or more walls of the container to receive the scaffold. Surfaces of the application that are not intended to receive a BNNT coating, such as any non-cryopump portions of a cryopump apparatus, may be formed from or coated with a material that the BNNT material does not readily stick to, such as Teflon.

In some embodiments, the BNNT materials may be partially or fully purified so as to remove boron particles and/or other impurities present in the BNNT material. Suitable methods for purification include those described in International Patent Application No. PCT/US2017/063729, filed Nov. 29, 2017, and incorporated by reference in its entirety. In some embodiments, the partially purified BNNT material (e.g., BNNT material after a boron removal process) may have small particles of a-BN, h-BN nanocages, h-BN nanosheets and BNNTs removed by one or more additional purification processes. In some embodiments, purified BNNT material may have almost all of the h-BN nanocages and h-BN nanosheets removed. It should be appreciated by one of ordinary skill in the art that the range and degree of purification may be optimized to maximize yield of useable material tailored for a given embodiment for a given application. Boron particles may act as relatively dense weights on the BNNTs and result in the undesirable increase in the compaction forces when the BNNT material is vibrated. The boron particles may have different chemical reactions with other materials compared with BN materials, such as BNNT, a-BN, h-BN nanocages, and h-BN nanosheets. As-synthesized BNNT materials produced by the high temperature high pressure method, for example, may have a surface area of about 100-200 $m^2$ per gram, and purified BNNT materials may have surface areas of about 350-550 $m^2$ per gram. Partially purified BNNT materials may have surface areas of about 300 $m^2$ per gram. Many applications benefit from higher surface areas, and purification and partial purification can increase the surface area of a BNNT material. Freeze drying and filtering techniques as described herein may work better with at least partially purified BNNT materials because the dispersants optimal for BNNTs are not the same as the dispersants optimal for the boron particles.

Figure 1:
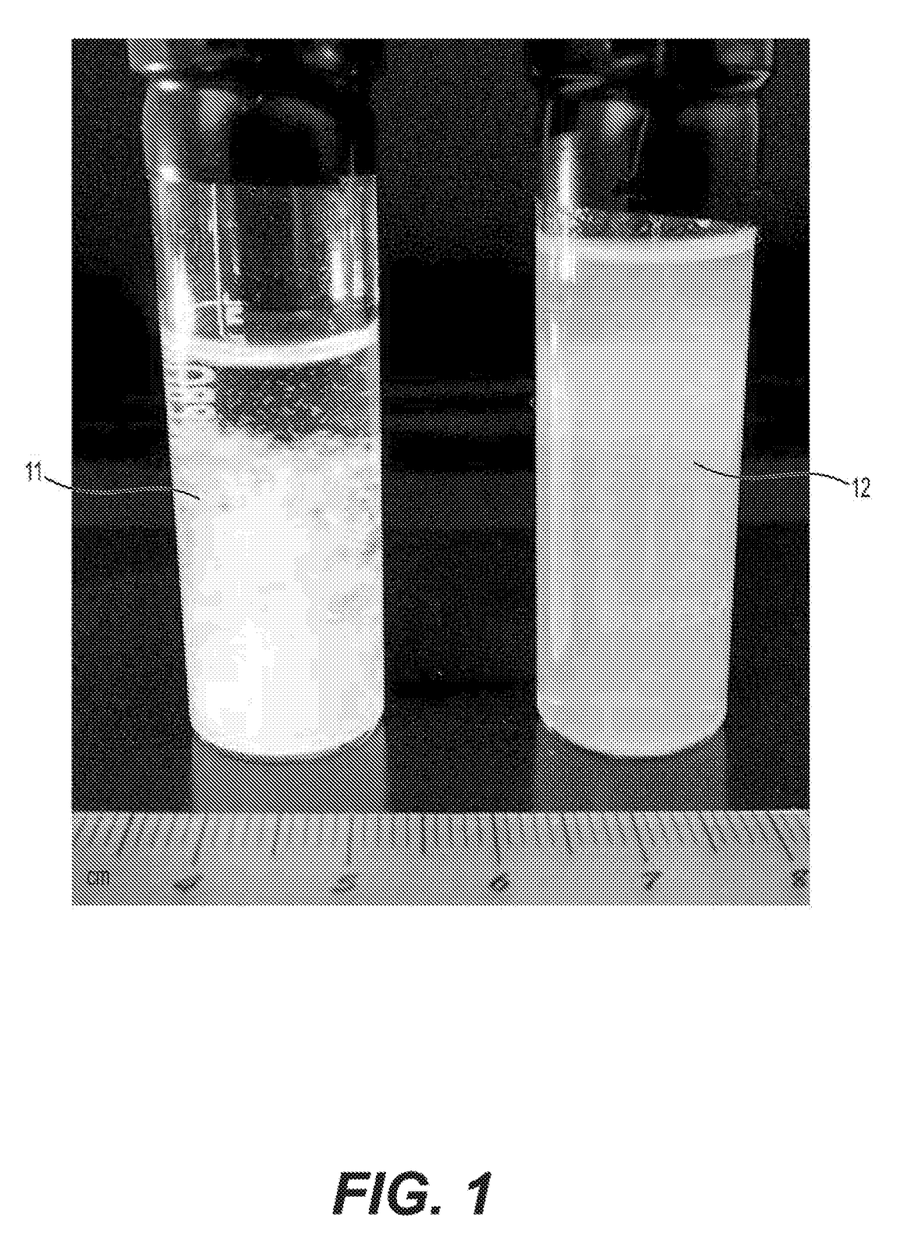
FIG. 1 shows partially purified BNNT material on the left and purified BNNT material on the right dispersed in isopropyl alcohol.

FIG. 1 shows a partially purified BNNT material 11 on the left and purified BNNT material 12 on the right. Both are dispersed in isopropyl alcohol by robust stirring. In some embodiments, light sonication, i.e. sonication that debundles the BNNT clusters but does not break the BNNTs, may also be utilized. The partially purified BNNT material 11 may slightly settle out whereas the purified BNNT material 12 remains dispersed. Depending on the application, both BNNT materials shown in FIG. 1 may be useful.

Partially purified and purified BNNT material may bond weakly on to the surface of many materials including plastics, glass, and metals. Coatings of partially purified and purified BNNT materials of 5-10 $mg/cm^2$ are disclosed herein. With a 5 $mg/cm^2$ covering and 300 $m^2/g$ surface area for partially purified BNNT material, a spray coated area of 1 $m^2$ will have 15,000 $m^2$ effective surface area. In some embodiments, BNNT material may be applied to buckypaper, i.e., one or more thin sheets made from carbon nanotubes and/or carbon nanotube grid paper, and/or BNNTs. Demonstrative BNNT buckypapers described herein are about 20-500 microns thick and have corresponding aerial surface densities of 1-25 $mg/cm^2$. The term "mat" used herein refers to a BNNT material with a thickness of about 500 microns or more, and may include multiple BNNT buckypapers or mats joined together. As used herein, the term "buckypapers/mats" means and refers to buckypapers and/or mats.

Figure 2:
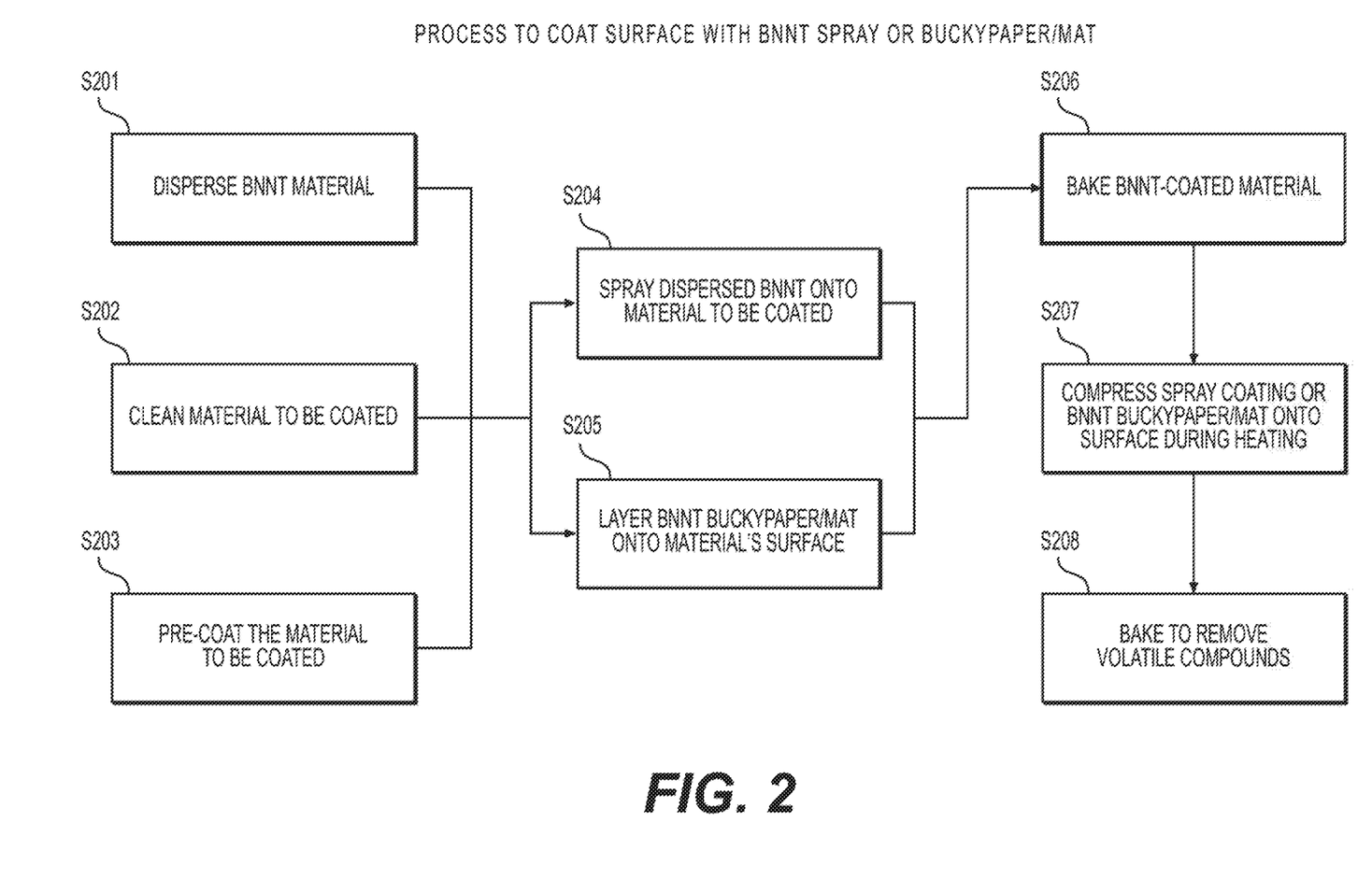
FIG. 2 illustrates a process for making BNNT spray and buckypaper/mat coatings according to an embodiment of the present approach.

FIG. 2 shows a flowchart of an embodiment of a process for making and applying a BNNT spray coating and/or buckypaper/mat according to the present approach. Under such processes, the BNNTs are conformally attached to the coated material. In some embodiments, the process includes dispersing the BNNT material S201, which may be a partially purified or fully purified BNNT material, in a dispersant such as isopropyl alcohol (IPA), methyl alcohol, ethyl alcohol, acetone, other volatile organic compounds, etc. It should be appreciated that other alcohols and dispersants work equally well. In some embodiments, the dispersant may be up to a 50-50 mixture of isopropyl alcohol and distilled water. In some embodiments, the density of partially purified or fully purified BNNT material is about 1-5 mg BNNT material per 10 ml of dispersant. In some embodiments, the material to be coated with BNNT material may be cleaned S202 to remove all grease, particulates, etc. Depending on the embodiment, cleaning S202 may be optional. The material to be coated may be cleaned of any hydrocarbons using methods known in the art, and/or methods set forth in International Patent Application PCT/US2017/063729, filed Nov. 29, 2017 and incorporated by reference in its entirety. Optionally, the material to be coated with the BNNT material may be pre-coated S203 with about 1-50 microns of a thermal plastic, indium, tin, a tin alloy or other solder, or a low-temperature melting glass. The selection of the pre-coating is determined by the application so as to match chemical and thermal requirements of the final application. Pre-coating is determined by the adhesion requirements for the final application. It should be appreciated that some applications will not require pre-coating S203.

In some embodiments, an atomizer may be used to spray S204 the dispersed BNNT material onto the material to be coated. Alternatively, a BNNT buckypaper/mat may be layered S205 onto the surface of the material to be coated such as to conformally match the shape of the surface. In some embodiments, the BNNT-coated material may be baked S206 to remove volatile organic compounds from the BNNT-coated material. For example, the BNNT-coated material may be heated to a temperature of about 60-140° C. to drive out volatile organic compounds. In some embodiments, the material may be heated with a heat gun, or placed in an oven held at one or more baking temperatures for a baking duration. Those of ordinary skill in the art should appreciate that the baking time and temperature may depend on the type(s) of volatile organic compounds expected or known to be present in a BNNT-coated material.

In some embodiments, the spray coating or BNNT buckypaper/mat may be compressed S207. Compression, particularly during baking or at elevated temperatures, improves the bonding of coatings and BNNTs. For example, the temperature may be raised to the melting point or glass transition temperature of the coating, such that the coating conformally connects or bonds to the BNNTs.

Optionally, if alcohol or other volatile organic compounds are present and need to be removed, the BNNT-coated material may be vacuum-baked S208. For example, the BNNT-coated material may be placed in a vacuum and heated for a baking duration at about 200° C. Alternatively, the BNNT-coated material may be vacuum baked in air, preferably at a baking higher temperature, and more preferably at about 450° C. In some embodiments, the baking temperature may be reduced if a low temperature coating, such as a thermoplastic or indium, is used that has a glass transition temperature at a lower temperature.

Figure 3:
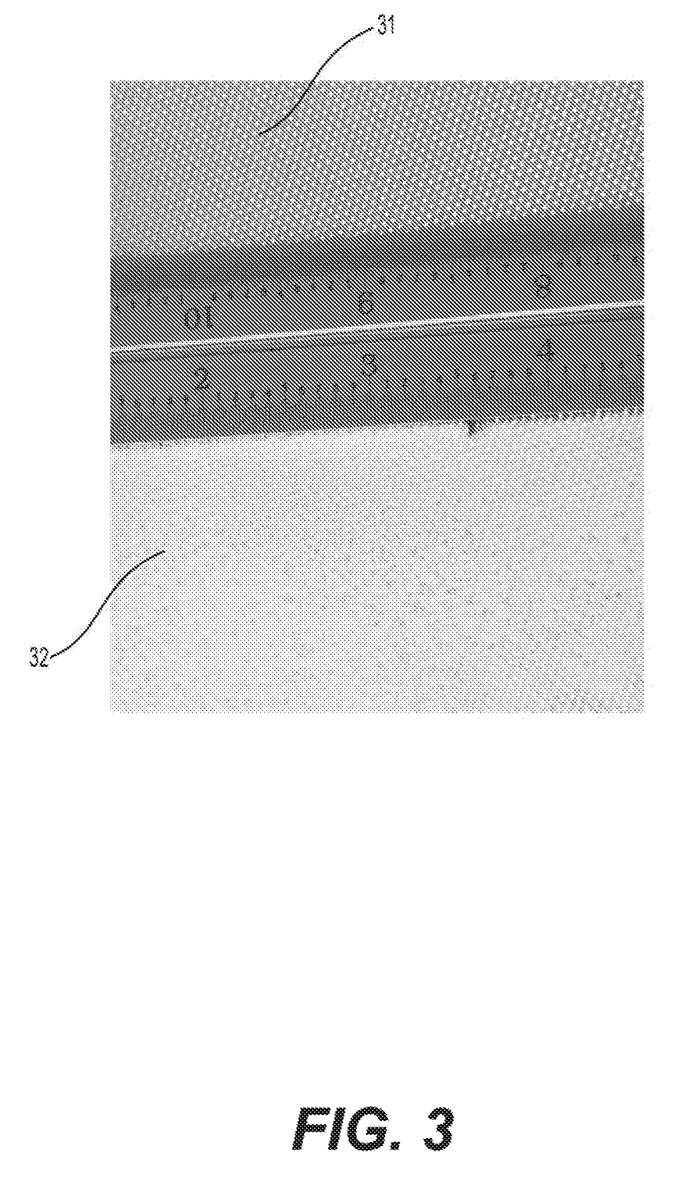
FIG. 3 shows a fiberglass weave with partially purified BNNT material sprayed on the bottom half of the weave according to an embodiment of the present approach.

FIG. 3 shows an embodiment of a fiberglass weave 31 with 8 mg/cm$^2$ of partially purified BNNT material on the bottom half of the sheet 32. The partially purified BNNT remains on the weave even when it is flexed or folded with local radii of curvature of several centimeters.

Figure 4:
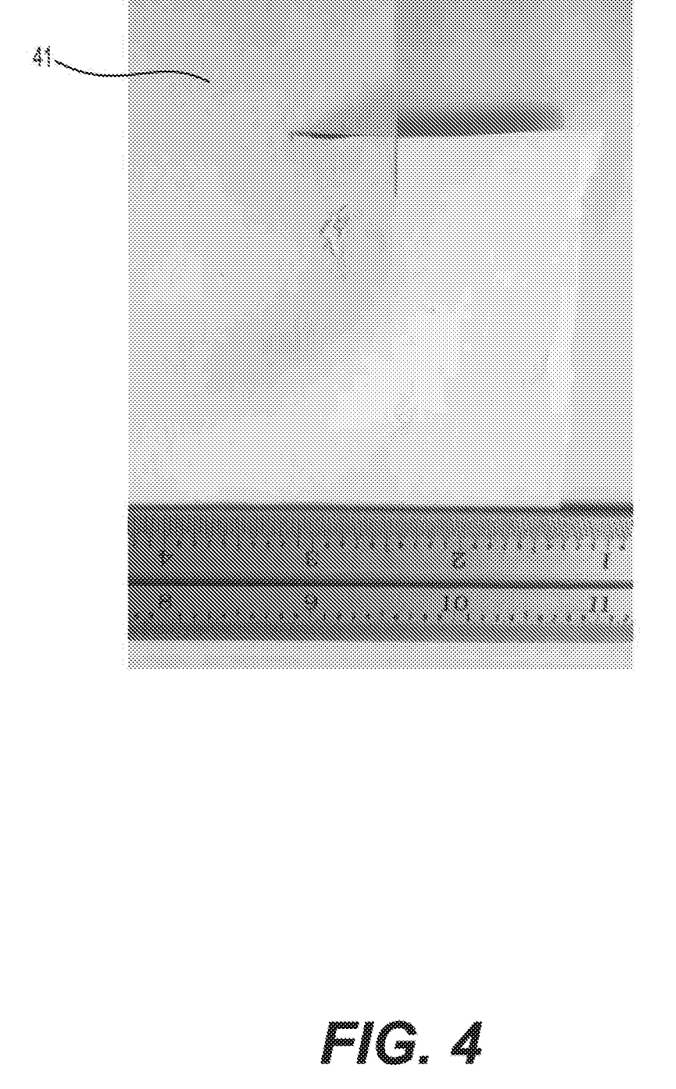
FIG. 4 shows an 80 mesh 316 stainless steel mesh sprayed with partially purified BNNT material according to an embodiment of the present approach.

FIG. 4 shows an embodiment according to the present approach in which 80 mesh 316 stainless steel has been spray-coated with 5 mg/cm$^2$ of partially purified BNNT material 41. The mesh is about 81% open (e.g., 81% of the area is free of BNNT material 41). The open space allows for materials to flow through the mesh. In this embodiment, the 316 stainless steel wires in the mesh are spaced 0.315 mm apart. Though the BNNT material may be weakly bonded to surfaces such as fiberglass and stainless steel mesh, as long as there is no mechanical scraping, vibrations, or solvents/dispersants such as alcohols present, the BNNT material may be sufficiently bonded to the surfaces such as are shown in FIGS. 3 and 4 to form large-volumes useful in many applications.

In some embodiments, freeze drying may be utilized to place BNNT materials on a scaffold or other structure. In some embodiments, a binder such as an epoxy may be used to assist the binding of the BNNT material to the scaffold. The addition of a binder depends on the application—for example, binders are typically not used for cryopump applications because binders may deteriorate at high temperatures and cryopumps often cycle between roughly 10 K and at least 500 K, and in some situations over 800 K. Additionally, binders may interfere with the ability of the BNNTs' surface to provide effective cryopumping of the gases being pumped. However, if, for example, a cryopump only needs to be heat cycled to near 400 K, indium may be used as a binder for the BNNT material as indium melts at 429.7 K. The indium may solder to some of the metals used in cryopumps and, with subsequent heating and compression of the BNNT material as described in FIG. 2, the indium may conformally hold the BNNT material to the surface. Thermoplastics and glass coatings may also form conformal bonding of the BNNT material to respective surfaces. In some embodiments, the binders for the conformal binding of the BNNT material to the wires and surfaces are about 1-50 microns in thickness, but they may extend beyond this range depending on the desired outcome.

Figure 5:
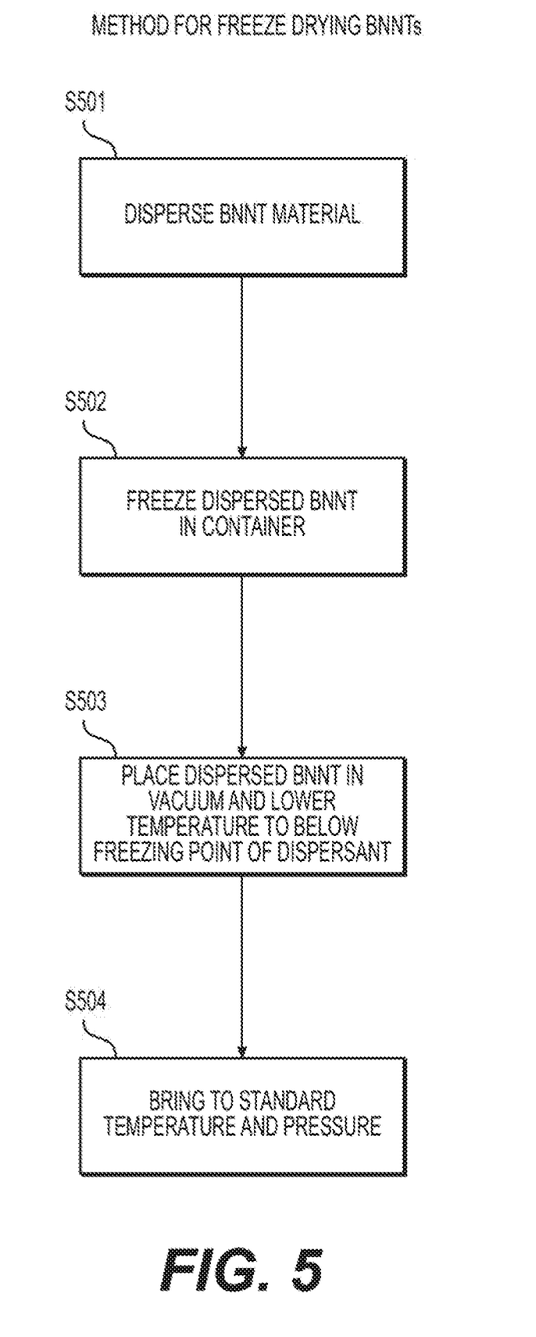
FIG. 5 illustrates an embodiment of a process for BNNT freeze drying according to the present approach.

FIG. 5 illustrates a flow chart for an embodiment of freeze drying according to the present approach. In some embodiments, partially purified and purified BNNT material may be dispersed S501 in one or more dispersants. For example, the dispersant may include one or more of methyl alcohol, ethyl alcohol, isopropyl alcohol, and a volatile organic compound. The BNNT material may be introduced into the dispersant by known methods, such as, for example, robust stirring or light sonication. A person of ordinary skill in the art can determine the appropriate weight percent of alcohol. For example, in some embodiments, the weight percent of alcohol may be about 1-10 weight percent. In some embodiments, the weight percent of alcohol may be below one weight percent. In some embodiments, methyl alcohol and distilled water may be used. Following dispersion, some dispersed BNNTs may require continued agitation to remain dispersed. Purified BNNTs may remain mostly dispersed after sitting. Partially purified BNNT material, e.g., BNNT material having undergone a boron removal stage, may remain dispersed for hours, whereas the as-synthesized material typically may be dominated by the presence of the boron particles and may not remain dispersed (unless the dispersion is based on the boron particles). Generally, the mass required of the as-synthesized BNNTs, partially purified BNNTs, or purified BNNT material may be dispersed in a volume of dispersant that matches the volume of the container.

Figure 6:
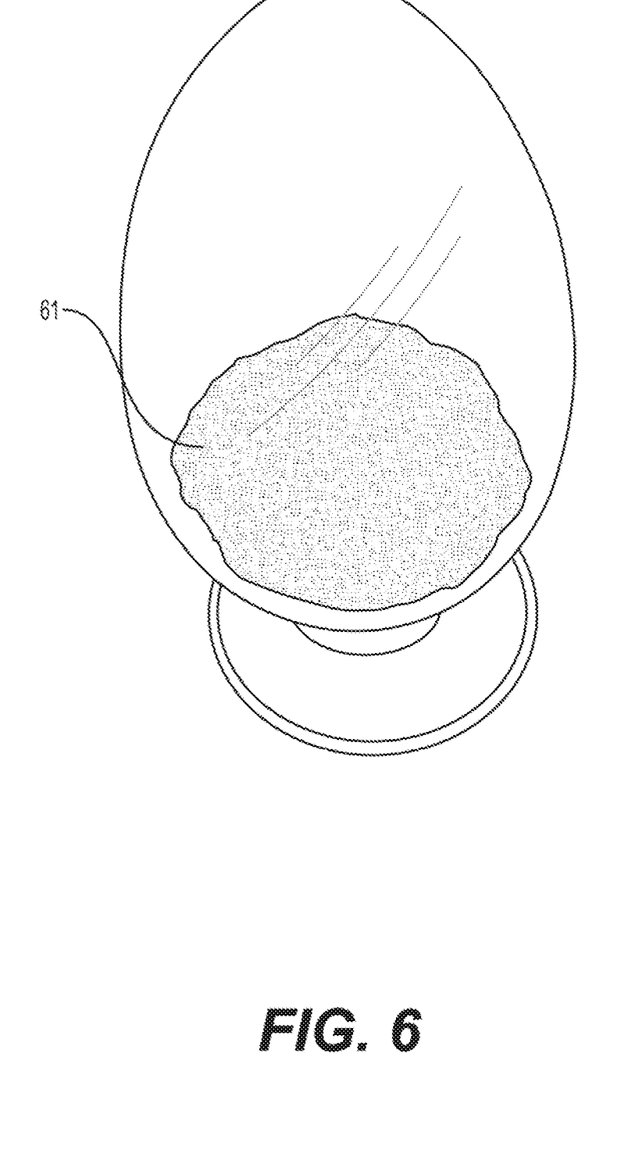
FIG. 6 illustrates freeze dried partially purified BNNT material as a powder according to an embodiment of the present approach.

Next, the dispersed BNNT may then introduced into a container S502 containing a scaffold or similar structure to be coated. For example, the dispersed BNNT may be poured into the container. Next, the container containing the BNNT-loaded dispersant may be placed in a chamber and frozen S503. Preferably, the freezing occurs quickly to reduce any BNNT material falling out of the dispersion. In some embodiment, the chamber pressure may be lowered to near vacuum. In some embodiments, the temperature may be adjusted to below the freezing point, i.e. from −5° C. to −80° C., depending on the alcohol content to induce evaporation. In some embodiments, the temperature may adjusted to −40° C. The dispersant may be allowed to evaporate away, leaving the BNNT material dispersed within and supported by the hierarchal scaffold or other structure. Those of ordinary skill in the art may use known methods to remove the dispersant. Once the dispersant is removed, the container may be returned to room temperature and pressure S504, or any other conditions for subsequent processing and handling needed for the particular application. For example, if the application is a cryopump, any non-cryopump portions of the container may be removed at standard temperature and pressure. FIG. 6 illustrates a sample of freeze dried partially purified BNNT material 61, which appears as a fluffy powder. The BNNT material 61 illustrated in FIG. 6 was prepared in an embodiment of the present approach, but in the absence of a scaffold or similar structure to be coated.

Figure 7:
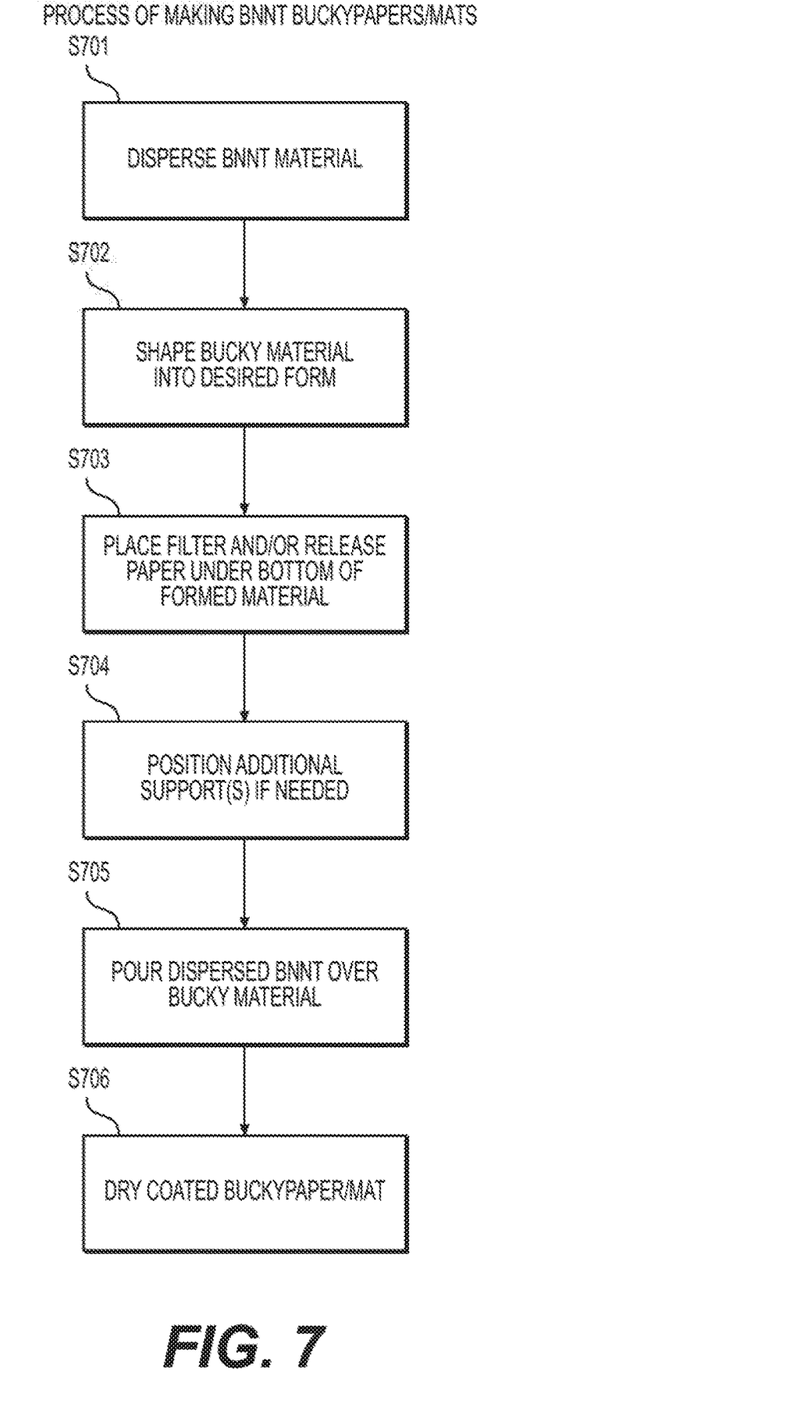
FIG. 7 illustrates a process for making BNNT buckypaper/mats according to an embodiment of the present approach.

Filtering techniques may also be utilized to coat buckypapers/mats with BNNTs. In some embodiments, multiple buckypaper/mats may be joined together, thereby increasing the volume of BNNTs and achieving any desired volume and/or shape for the ultimate application. FIG. 7 shows an embodiment of a filtering process according to the present approach. In some embodiments, a partially purified or fully purified BNNT material is dispersed S701 in a dispersant. Dispersing may be achieved by known means, including, as examples, robust stirring and/or light sonication. The density of the dispersed BNNT may be determined according to the ultimate application. In some embodiments, the density may be about 0.1-5 g/L. In some embodiments, the dispersant may be one or more of isopropyl alcohol, methyl alcohol, ethyl alcohol, volatile organic compounds, or other known dispersant(s). The dispersing solution may include distilled water. The ratio of alcohol to water may be about 100:0 (alcohol only), between 100:0 and 50:50, or below 50:50. Those of ordinary skill in the art can determine the optimum ratio depending on the ultimate application. A mold may be prepared S702, preferably having the desired shape of the buckypaper/mat. In some embodiments, the mold may be a metal, such as aluminum, or plastic. The scaffold material may be positioned S703 for receiving the dispersed BNNT. In some embodiments, each buckypaper/mat may include a layer of woven stainless steel grid or other material used as a hierarchal scaffold. Other materials, such as polymer fibers, glass fibers, and even BNNT fibers, may be used to form the scaffold. In some embodiments, the scaffold grid may be covered by stainless steel mesh or wool. The grid may form a bottom layer, and be placed on top of a filter membrane and/or a release paper. In some embodiments, the diameter of the woven grid may be about 50-200 microns, though it may exceed this range in some embodiments. The volume between the stainless steel wire grid may be filled with stainless steel mesh such as the 80 mesh 316 stainless steel discussed above or stainless steel wool wherein the average wire-to-wire spacing is about 0.3-5 mm, though spacing may exceed this range in some embodiments. The diameter of the stainless steel wire forming the wool may be about 10-50 microns, though it may exceed this range in some embodiments. For very large cryopumps, additional layers of course woven stainless steel wire grid may be required to support the large structure. It should be appreciated that the scaffolding structure may be varied, depending on the desired outcome and ultimate application. In some embodiments, the mold may include one or more additional supports so as to provide rigidity to the structure S704. Next, the dispersed BNNT material may be poured over the buckypaper/mat S705 using conventional techniques, and then dried S706 using conventional techniques such as described above for evaporating alcohols from the spray coatings.

Figure 8:
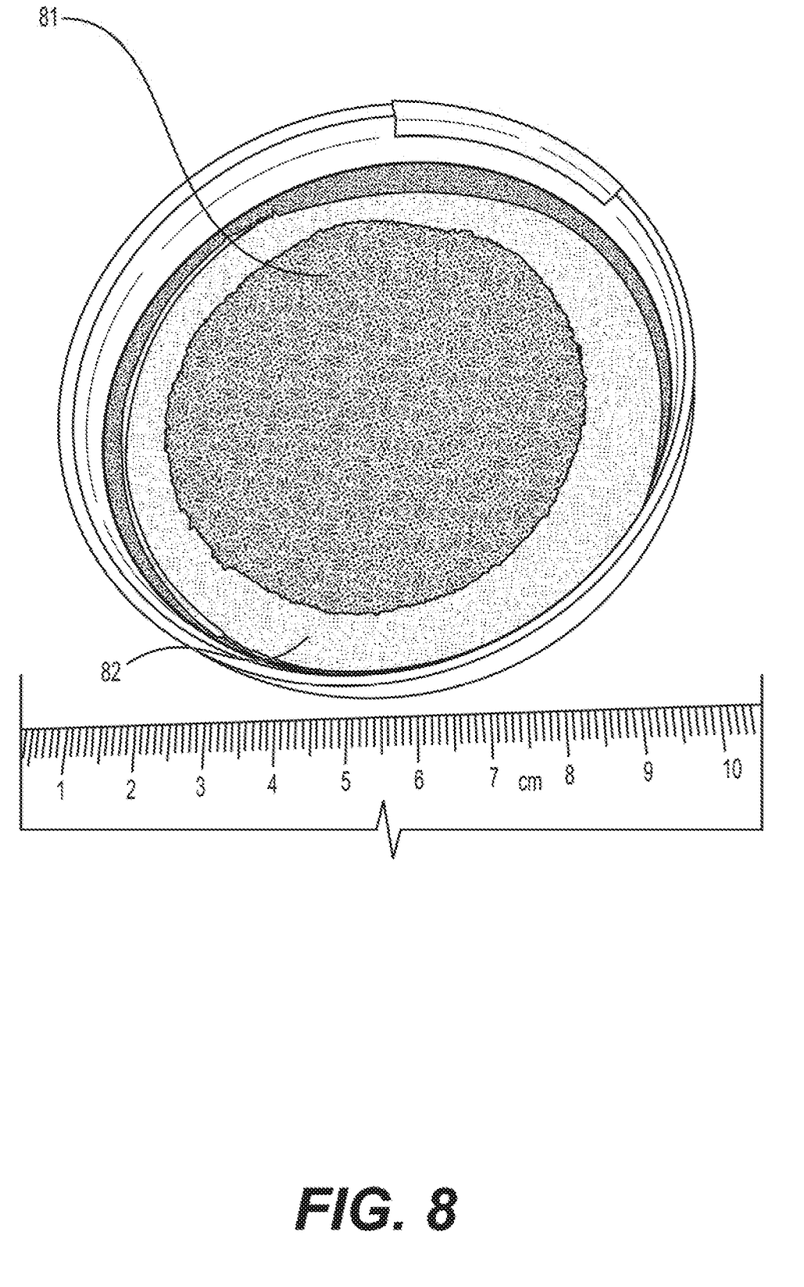
FIG. 8 illustrates partially purified BNNT material collected above the filtration membrane as a BNNT buckypaper/mat according to an embodiment of the present approach.

FIG. 8 illustrates a partially purified BNNT material 81 collected above a filtration membrane 82 according to an embodiment of the present approach. The hierarchal scaffold does not appear in this illustration, but may be incorporated into the BNNT material 81 as described above. In some embodiments, the hierarchal structure may be first coated with a solder such as indium, tin, an indium or tin alloy, a thermal plastic, or a glass with a low transition temperature. Then, the partially purified or purified BNNT material, loaded onto the hierarchal structure, may be heated to the melting point of the respective coating to assist in conformally bonding a small fraction of the BNNT material to the surfaces to thereby enhance the mechanical stability of the final assembly. As should be appreciated by one skilled in the art of freeze drying and filtration systems, the choice between the techniques may depend on the desired density of BNNT material in the final system, the geometry of the containers, the time required and the cost of the materials and process.

It should be appreciated that the ultimate application may determine the material(s) used to form scaffolding or other supporting structures. For example, the extreme temperature range required by a cryopump may drive the choice of stainless steel for the scaffold supporting the BNNT material. In some embodiments, if only room temperature performance is required, and the chemicals present in the environment of the final system are not reactive to the scaffold material, the wires and supports may be composed of materials such as Kevlar®, carbon fiber, or glass fiber. In some embodiments, additional glues or fillers may be added to the BNNT material.

Figure 9:
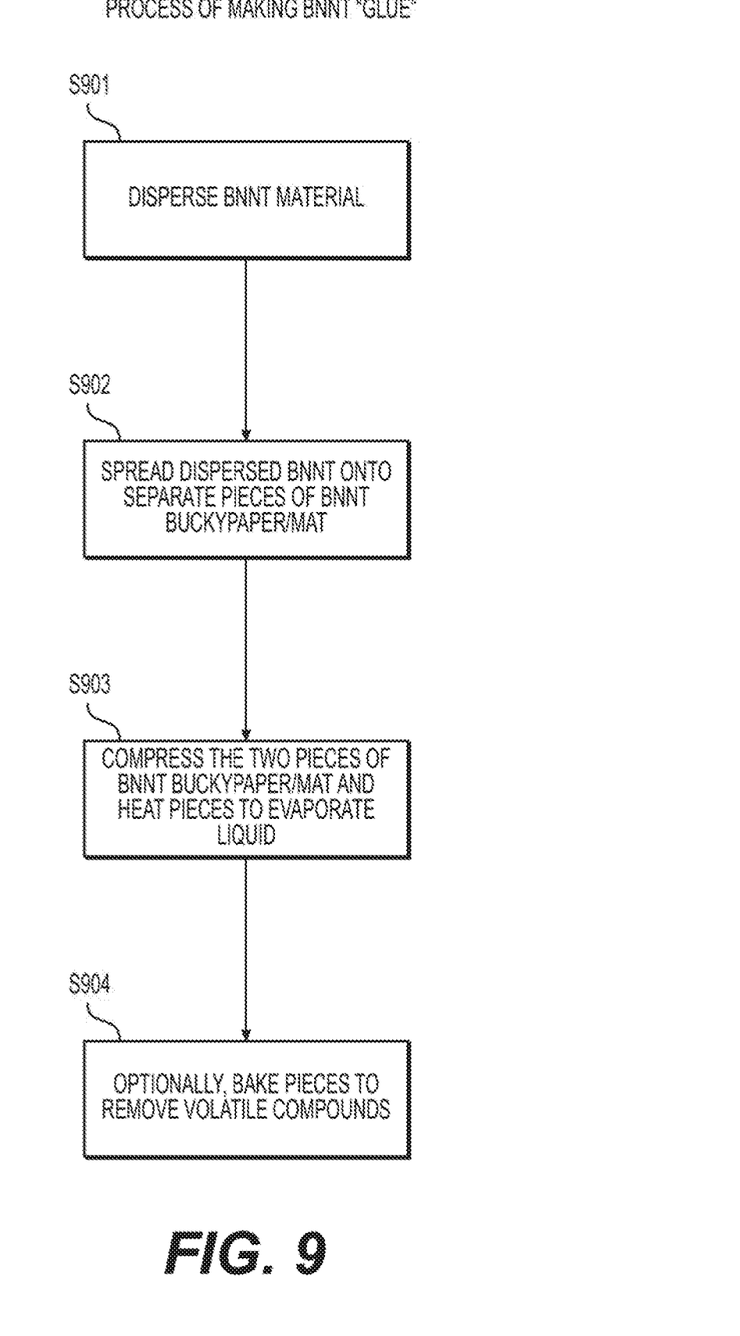
FIG. 9 illustrates an embodiment of a process for making and applying BNNT "glue" under the present approach

In some embodiments, a BNNT "glue" may be utilized to join BNNT buckypapers/mats and surface spray coatings (if any). FIG. 9 illustrates an embodiment of a process for BNNT glue according to the present approach. In some embodiments, partially purified or fully purified BNNT material may dispersed in an alcohol or alcohol-water mixture as described above 5901 to form a BNNT "glue" material. The BNNT "glue" can be the same as the material going into form the sprays and buckypapers with the requirement of the BNNT material density as described below. What makes it BNNT "glue" is how it is applied in the processing. In some embodiments, the partially purified or fully purified BNNT material may be dispersed by robust stirring and/or light sonication in a dispersant to achieve a final density of about 0.1-3 mg/ml of BNNT material. In some embodiments, the dispersant may be one or more of isopropyl alcohol, methyl alcohol, ethyl alcohol, volatile organic compound, or similar dispersant, and may include distilled water. In some embodiments, the ratio of alcohol to water may be from about 100:0 (alcohol only) to as low as 50:50, though a person of ordinary skill in the art may determine that lower ratio is optimum for some embodiments. The BNNT "glue" is then spread S902 onto separate pieces of BNNT buckypapers/mats. The amount of BNNT "glue" to use depends on the particular embodiment. In some embodiments, for example, the glue is spread to a density of about 0.1-1 ml/cm$^2$. Next, the two pieces of BNNT buckypapers/mats may be compressed together S903. The compressed pieces may also be heated to evaporate liquids. For some embodiments, heating to about 80-120° C. for 10 minutes to 2 hours is adequate to remove liquids from the BNNT "glue" material. Optionally, if any alcohols need to be removed, the BNNT buckypapers/mats may be baked S904. For example, the glued pieces may be placed in a vacuum at about 200° C., or baked in air at about 450° C., for a baking duration that may be determined by those of ordinary skill in the art.

Figure 10:
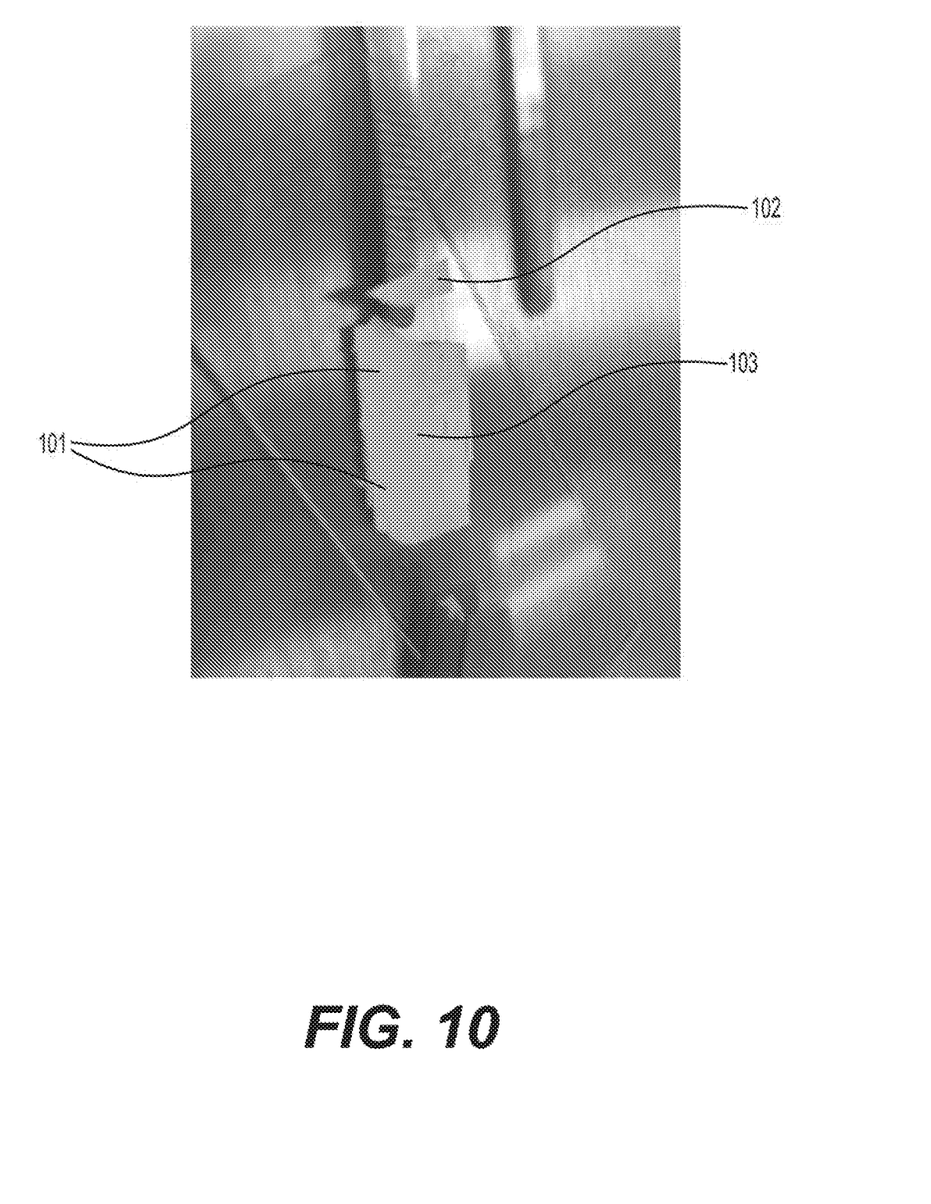
FIG. 10 shows two pieces of partially purified BNNT material as buckypapers joined by BNNT "glue" according to an embodiment of the present approach.

The BNNT "glue" methods have been demonstrated to produce exceptional in-plane bonding. For example, the G2C fracture test in-plane bond, as observed in a lap sheer testing, may be stronger than the buckypapers/mats themselves. The G1C fracture peel test shows a very weak bonding in the G1C though-plane direction. FIG. 10 shows prototype BNNT buckypapers/mats 101 joined by BNNT "glue" produced in an embodiment of the present approach. FIG. 10 shows a break from the lap shear test occurring in one of the original BNNT buckypapers/mat pieces 102, and not section 103 having the joint formed using BNNT "glue" according to the present approach.

Figure 11:
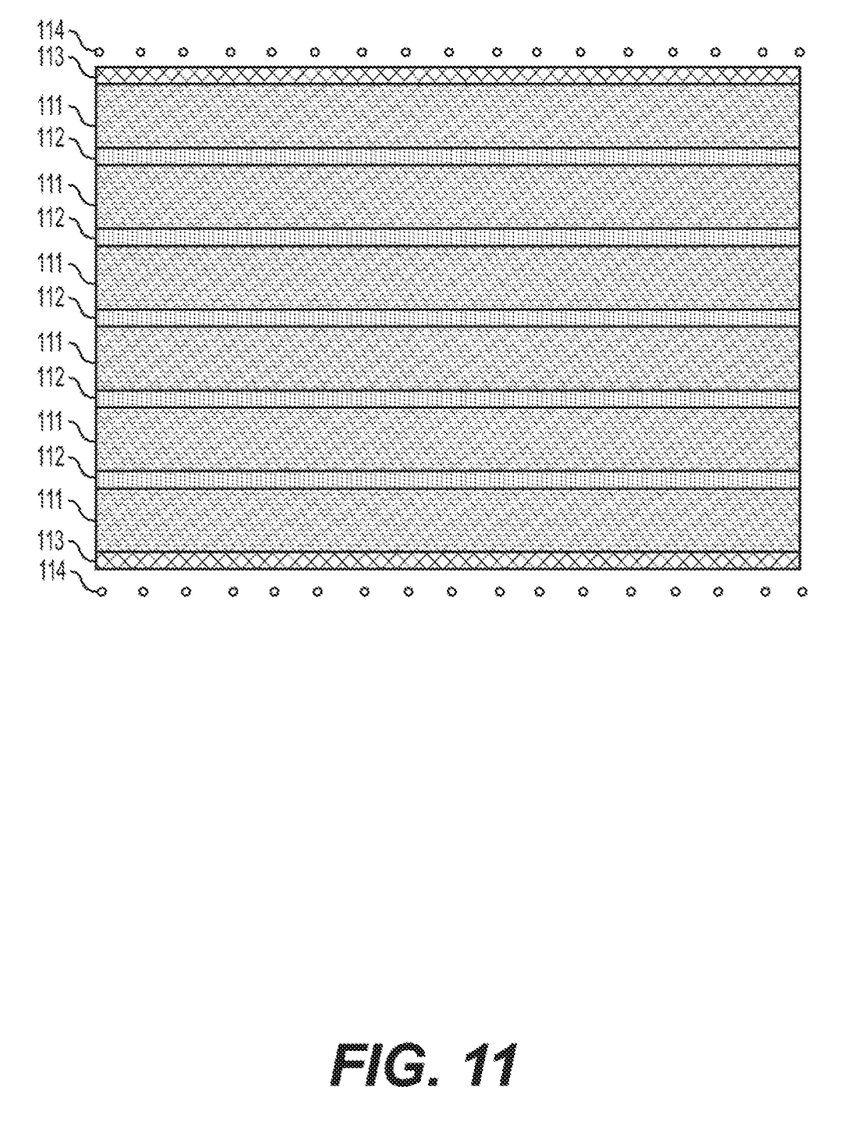
FIG. 11 illustrates BNNT buckypapers/mats joined together by BNNT "glue" in a hierarchal wire frame according to an embodiment of the present approach.

It should be appreciated that the present approach enables a wide variety of configurations. As one example, FIG. 11 illustrates an arrangement of multiple BNNT buckypapers/mats 111 joined by BNNT "glue" 112. This embodiment includes a wire hierarchal structure of fine mesh 113 and course weave 114. The BNNT "glue" 112 provides transverse adhesion, while the wire hierarchal structure 113 and 114 provides the vertical stability to the overall assembly. With this architecture, large volumes can be filled with BNNT material having a large surface area and mechanical stability.

The terminology used herein is for the purpose of describing particular embodiments only and is not intended to be limiting of the approach. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The present approach may be embodied in other specific forms without departing from the spirit or essential characteristics thereof. The disclosed embodiments are therefore to be considered in all respects as illustrative and not restrictive, the scope of the present approach being indicated by the claims of the application rather than by the foregoing description, and all changes which come within the meaning and range of equivalency of the claims are therefore intended to be embraced therein. One of ordinary skill in the art should appreciate that numerous possibilities are available, and that the scope of the present approach is not limited by the embodiments described herein.

What is claimed is:

1. A method of forming a boron nitride nanotube ("BNNT") configuration, the method comprising:
    providing a scaffold support structure having at least one rigid support selected from the group consisting of a wire mesh material, a stainless steel mesh material, a woven stainless steel grid, and a glass fiber;
    dispersing BNNTs in a dispersant;
    applying the dispersed BNNTs onto the scaffold support structure to disperse the BNNTs within and supported by the scaffold support structure as a conformal coating;
    removing the dispersant and leaving the BNNTs on the scaffold support structure to form a BNNT-conformally coated scaffold support structure having stable density and structural strength; and
    inserting the BNNT-conformally coated scaffold support structure into one of a cryopump, a transition radiation detector, and a neutron detector.

2. The method of claim 1, wherein applying the dispersed BNNTs comprises at least one of conformally spray coating the dispersed BNNTs onto the scaffold support structure; conformally layering the dispersed BNNTs onto the scaffold support structure; conformally freeze drying the dispersed BNNTs on the scaffold support structure; and conformally spreading the dispersed BNNTs onto the scaffold support structure and a second scaffold support structure.

3. The method of claim 1, wherein the scaffold support structure comprises at least one of a wire mesh material; a course weave material; stainless steel, polymer fibers, and glass fibers.

4. The method of claim 1, wherein the BNNT material comprises at least one of a partially purified BNNT material and a purified BNNT material.

5. The method of claim 1, further comprising baking the BNNT-conformally coated scaffold support structure.

6. The method of claim 5, wherein the baking is performed at a baking temperature in the range of 60-140° C.

7. The method of claim 1, wherein the dispersant comprises at least one of isopropyl alcohol, methyl alcohol, ethyl alcohol and acetone.

8. The method of claim 1, further comprising applying a plurality of dispersed BNNT layers to the scaffold support structure.

9. The method of claim 1, further comprising compressing the BNNT-conformally coated scaffold support structure.

10. The method of claim 5, wherein baking the BNNT-conformally coated scaffold support structure is performed in a vacuum at a baking temperature to remove volatile organic compounds, and/or baking the BNNT-conformally coated scaffold support structure in air at a baking temperature to convert residual carbon to carbon dioxide.

11. The method of claim 1, wherein applying the dispersed BNNTs comprises freezing the dispersed BNNTs conformally on the scaffold support structure, and evaporating the dispersant.

12. The method of claim 11, wherein evaporating the dispersant comprises placing the dispersed BNNT material in a vacuum and lowering the temperature to below the freezing point of the dispersant.

13. The method of claim 11, wherein the dispersant comprises distilled water and at least one of methyl alcohol, ethyl alcohol, isopropyl alcohol, and acetone.

14. The method of claim 1, wherein the scaffold support structure comprises a plurality of buckypaper/mat surfaces supported by at least one of a wire mesh material, a stainless steel mesh material, a woven stainless steel grid, and a glass fiber, and further comprising shaping the buckypaper/mat into a desired shape conforming to the scaffold support structure; pouring the dispersed BNNTs over the shaped buckypaper/mat surfaces and wire hierarchal structure and a filter to form BNNT-conformally coated buckypaper/mat surfaces; and drying the BNNT-conformally coated buckypaper/mat surfaces.

15. The method of claim 14, wherein the dispersant comprises at least one of methyl alcohol, ethyl alcohol, isopropyl alcohol, and acetone.

16. The method of claim 1, wherein the dispersed BNNTs comprise a BNNT glue having from 0.1 to 3 mg of BNNT material per ml of dispersant.

17. The method of claim 16, further comprising spreading the BNNT glue onto the scaffold support structure and a second scaffold support structure, joining the scaffold support structure and the second scaffold support structure to form a joined scaffold support structure, compressing the joined scaffold support structure, and heating the joined scaffold support structure to evaporate dispersant.

18. The method of claim 1, further comprising coating the scaffold support structure with one of tin, tin alloy, solder, and a low-temperature melting glass.

* * * * *